United States Patent
Tran et al.

(10) Patent No.: US 10,209,279 B2
(45) Date of Patent: Feb. 19, 2019

(54) METHODS AND APPARATUS FOR MONITORING A LEVEL OF A REGULATED SOURCE

(71) Applicant: ALLEGRO MICROSYSTEMS, LLC, Manchester, NH (US)

(72) Inventors: Sam Tran, Lee, NH (US); Jay M. Towne, Bow, NH (US); P. Karl Scheller, Manchester, NH (US)

(73) Assignee: ALLEGRO MICROSYSTEMS, LLC, Manchester, NH (US)

( * ) Notice: Subject to any disclaimer, the term of this patent is extended or adjusted under 35 U.S.C. 154(b) by 114 days.

(21) Appl. No.: 14/748,692

(22) Filed: Jun. 24, 2015

(65) Prior Publication Data

US 2016/0377663 A1 Dec. 29, 2016

(51) Int. Cl.
*G01R 19/165* (2006.01)
*G01R 31/40* (2014.01)
(Continued)

(52) U.S. Cl.
CPC .......... *G01R 19/165* (2013.01); *G01R 31/28* (2013.01); *G01R 31/40* (2013.01); *G01R 33/02* (2013.01); *G01D 5/145* (2013.01)

(58) Field of Classification Search
CPC ...... G01R 19/165; G01R 33/02; G01R 31/28; G01R 31/40; G01D 5/145
See application file for complete search history.

(56) References Cited

U.S. PATENT DOCUMENTS 4,797,608 A * 1/1989 White .................... G05F 1/571
  324/133
5,926,383 A * 7/1999 Pilukaitis ................ H02M 1/32
  361/18

(Continued)

FOREIGN PATENT DOCUMENTS

EP 0303289 2/1989

OTHER PUBLICATIONS

Search Report and Written Opinion dated Sep. 8, 2016 for PCT Application No. PCT/US2016/037560; 14 pages.

(Continued)

*Primary Examiner* — Son Le
*Assistant Examiner* — Akm Zakaria
(74) *Attorney, Agent, or Firm* — Daly, Crowley, Mofford & Durkee, LLP

(57) ABSTRACT

A monitor circuit for monitoring a level of a first and second regulated source may monitor a voltage level of regulated voltages or a current level of regulated currents. In an embodiment, the monitor circuit includes circuitry responsive to a first regulated voltage and to a second regulated voltage. A first circuit responsive to the first regulated voltage and to the second regulated voltage generates a first error signal indicative of at least one of an overvoltage condition of the first regulated voltage and an undervoltage condition of the second regulated voltage. A second circuit responsive to the first regulated voltage and to the second regulated voltage generates a second error signal indicative of at least one of an undervoltage condition of the first regulated voltage and an overvoltage condition of the second regulated voltage. A method for monitoring the levels of first and second regulated sources is also provided.

17 Claims, 8 Drawing Sheets

(51) Int. Cl.
*G01R 31/28* (2006.01)
*G01R 33/02* (2006.01)
*G01D 5/14* (2006.01)

(56) References Cited

U.S. PATENT DOCUMENTS

| | | | |
|---|---|---|---|
| 6,320,439 B1* | 11/2001 | Garbelli | G01R 31/40 |
| | | | 327/198 |
| 2006/0164052 A1* | 7/2006 | Kosht | G05F 1/56 |
| | | | 323/282 |
| 2008/0030191 A1 | 2/2008 | Nishikawa | |
| 2008/0315808 A1 | 12/2008 | Mishima | |
| 2009/0167093 A1 | 7/2009 | Nguyen et al. | |
| 2014/0084835 A1 | 3/2014 | Kadowaki et al. | |
| 2014/0176110 A1* | 6/2014 | Lamar | G05F 3/02 |
| | | | 323/311 |
| 2015/0185284 A1* | 7/2015 | Milano | G01R 31/2884 |
| | | | 324/251 |

OTHER PUBLICATIONS

International Preliminary Report on Patentability dated Jan. 4, 2018 for PCT Application No. PCT/US2016/037560; 10 pages.
Response to Official Communication dated Jan. 19, 2018 for European Application No. 16734784.8 as filed on Jul. 30, 2018; 17 Pages.

\* cited by examiner

METHODS AND APPARATUS FOR MONITORING A LEVEL OF A REGULATED SOURCE

CROSS REFERENCE TO RELATED APPLICATIONS

Not Applicable.

STATEMENT REGARDING FEDERALLY SPONSORED RESEARCH

Not Applicable.

FIELD

This disclosure relates generally to circuits, and, more particularly, to monitor circuits and related techniques for monitoring a voltage level of regulated voltages and/or a current level of regulated currents.

BACKGROUND

As is known, electronic circuits are used in a variety of applications. One example application is in sensing applications where a circuit including one or more sensing elements (e.g., pressure sensing elements, temperature sensing elements, light sensing elements, acoustic sensing elements, and magnetic field sensing elements) is used to detect one or more parameters (e.g., pressure, temperature, light, sound, magnetic field). Magnetic field sensors, for example, are circuits including one or more magnetic field sensing elements, generally in combination with other circuit components (e.g., analog, digital and/or mixed signal components), and are used to detect a magnetic field.

In motion (e.g., rotation) detectors, for example, a magnetic field sensor may used to detect motion of an object, such as a ferromagnetic object, for example, a gear or ring magnet. A magnetic field associated with the object is typically detected by one or more magnetic field sensing elements, such as a Hall effect elements or a magnetoresistance elements (e.g., giant magnetoresistance (GMR) elements), which provide a signal (i.e., a magnetic field signal) proportional to a detected magnetic field. One example motion detector is described in U.S. Pat. No. 8,624,588 entitled "Apparatus and Method for Providing an Output Signal Indicative of a Speed of Rotation and a Direction of Rotation as a Ferromagnetic Object," which is assigned to the assignee of the present disclosure and incorporated herein by reference in its entirety.

The magnetic field sensing elements and other circuitry may have different power requirements and, thus, may be powered by signals (e.g., voltage or current signals) of varying levels (e.g., voltage or current levels) as may be generated by one or more signal sources (e.g., voltage or current regulators). Some magnetic field sensor integrated circuits (ICs) contain signal regulation circuitry and methods to provide substantially fixed output signals (e.g., voltage or current signals) to power the magnetic field sensing elements and other circuit components.

In high precision applications such as automobiles, accuracy variations in the detected motion of a target object (e.g., resulting from irregularities in a sensed target profile of the target object) can be problematic. Engine ignition timing, for example, depends on consistent detection accuracy. As one example, when magnetic field sensing elements and other circuitry of a magnetic field sensor IC are not powered properly, for example, detection accuracy of the magnetic field sensor IC can be negatively impacted. Furthermore, in safety critical applications such as automobiles, compliance with standards such as Automotive Safety Integrity Level (ASIL) standards, generally require safety mechanisms to ensure proper circuit operation.

SUMMARY

The present disclosure provides circuitry and associated methods capable of monitoring a voltage level of regulated voltages and/or a current level of regulated currents. The described circuitry and methods can detect errors (e.g., overvoltage conditions, undervoltage conditions, overcurrent conditions and/or undercurrent conditions) in regulated voltages and/or regulated currents as may be generated by one or more voltage sources and/or current sources, for example, and provide an indication of the detected errors through one or more error signals.

In one aspect, a monitor circuit for monitoring a voltage level of a first regulated voltage and a second regulated voltage includes circuitry responsive to the first regulated voltage and to the second regulated voltage. A first circuit responsive to the first regulated voltage and to the second regulated voltage generates a first error signal indicative of at least one of an overvoltage condition of the first regulated voltage and an undervoltage condition of the second regulated voltage. A second circuit responsive to the first regulated voltage and to the second regulated voltage generates a second error signal indicative of at least one of an undervoltage condition of the first regulated voltage and an overvoltage condition of the second regulated voltage.

The monitor circuit may include one or more of the following features. The first circuit may be powered by the first regulated voltage and the second circuit may be powered by the second regulated voltage. The first regulated voltage may be generated by a first regulator and the second regulated voltage may be generated by a second regulator. The first circuit may include a first comparator having a first input responsive to the first regulated voltage and a second input responsive to the second regulated voltage. The second circuit may include a second comparator having a first input responsive to the second regulated voltage and a second input responsive to the first regulated voltage. The first circuit may include a first resistor divider coupled to the first regulated voltage to generate a first voltage and a first comparator having a first input responsive to the first voltage and a second input responsive to the second regulated voltage.

The second circuit may include a second resistor divider coupled to the second regulated voltage to generate a second voltage and a second comparator having a first input responsive to the second voltage and a second input responsive to the first regulated voltage. The first resistor divider and the second resistor divider may be substantially the same. At least one of the first and second comparators may have hysteresis. The first regulated voltage and the second regulated voltage may be substantially the same. The monitor circuit may be provided on an integrated circuit. The integrated circuit may be a magnetic field sensor. The magnetic field sensor may include at least one Hall effect element. The at least one Hall effect element may be a planar Hall element, a vertical Hall element, or a Circular Vertical Hall (CVH) element. The magnetic field sensor may include at least one magnetoresistance element. The at least one magnetoresistance element may be an anisotropic magnetoresistance (AMR) element, a giant magnetoresistance (GMR)

element, a tunneling magnetoresistance (TMR) element, a magnetic tunnel junction (MTJ) element, or a spin valve element. The integrated circuit may include a controller responsive to the first error signal and the second error signal to generate an error output signal indicative of one or more of the overvoltage condition of the first regulated voltage, the undervoltage condition of the second regulated voltage, the undervoltage condition of the first regulated voltage, and the overvoltage condition of the second regulated voltage. The monitor circuit and at least one of the first regulator and the second regulator may be provided on an integrated circuit.

In another aspect, a method for monitoring a voltage level of a first regulated voltage and a second regulated voltage includes comparing the first regulated voltage to the second regulated voltage to generate a first error signal indicative of at least one of an overvoltage condition of the first regulated voltage and an undervoltage condition of the second regulated voltage. The method additionally includes comparing the second regulated voltage to the first regulated voltage to generate a second error signal indicative of at least one of an undervoltage condition of the first regulated voltage and an overvoltage condition of the second regulated voltage.

In yet another aspect, a monitor circuit for monitoring a voltage level of a first regulated voltage and a second regulated voltage includes means for generating a first error signal in response to monitoring the voltage level of the first regulated voltage and the second regulated voltage. The first error signal may be indicative of at least one of an overvoltage condition of the first regulated voltage and an undervoltage condition of the second regulated voltage. The monitor circuit additionally includes means for generating a second error signal in response to monitoring the voltage level of the first regulated voltage and the second regulated voltage. The second error signal may be indicative of at least one of an undervoltage condition of the first regulated voltage and an overvoltage condition of the second regulated voltage.

In yet another aspect, a monitor circuit for monitoring a voltage level of a first regulated voltage and a second regulated voltage includes at least two multiplexers. Each of the at least two multiplexer has a first input responsive to the first regulated voltage, a second input responsive to the second regulated voltage, and a third input responsive to a threshold voltage and an output at which a selected one of the first regulated voltage, the second regulated voltage and the threshold voltage is provided. The monitor circuit additionally includes a comparator having a first input responsive to the output of a first one of the multiplexers, a second input responsive to the output of a second one of the multiplexers, and an output at which an error signal is provided. The error signal may be indicative of a selected one of an overvoltage condition of the first regulated voltage, an undervoltage condition of the second regulated voltage, an undervoltage condition of the first regulated voltage, and an overvoltage condition of the second regulated voltage.

The monitor circuit may include one or more of the following features. The comparator may be powered by a third regulated voltage. The threshold voltage may be generated from the third regulated voltage. The output of the multiplexers may be controlled by one or more control signals received from a controller. The first regulated voltage may be generated by a first regulator and the second regulated voltage may be generated by a second regulator. The monitor circuit may be provided on an integrated circuit. The integrated circuit may be a magnetic field sensor. The magnetic field sensor may include at least one Hall effect element. The at least one Hall effect element may be a planar Hall element, a vertical Hall element, or a Circular Vertical Hall (CVH) element. The magnetic field sensor may include at least one magnetoresistance element. The at least one magnetoresistance element may be an anisotropic magnetoresistance (AMR) element, a giant magnetoresistance (GMR) element, a tunneling magnetoresistance (TMR) element, a magnetic tunnel junction (MTJ) element, or a spin valve element.

In yet another aspect, a monitor circuit for monitoring a current level of a first regulated current and a second regulated current includes circuitry responsive to the first regulated current and to the second regulated current. A first circuit responsive to the first regulated current and to the second regulated current generates a first error signal indicative of at least one of an overcurrent condition of the first regulated current and an undercurrent condition of the second regulated current. A second circuit responsive to the first regulated current and to the second regulated current generates a second error signal indicative of at least one of an undercurrent condition of the first regulated current and an overcurrent condition of the second regulated current.

The monitor circuit may include one or more of the following features. The first circuit may be powered by a first regulated voltage and the second circuit may be powered by a second regulated voltage. The first regulated current may be generated by a first current source and the second regulated current may be generated by a second current source. The first circuit may include a first comparator having a first input responsive to the first regulated current and a second input responsive to the second regulated current. The second circuit may include a second comparator having a first input responsive to the second regulated current and a second input responsive to the first regulated current.

BRIEF DESCRIPTION OF THE DRAWINGS

The foregoing features of the disclosure, as well as the disclosure itself may be more fully understood from the following detailed description of the drawings, which.

DETAILED DESCRIPTION

Figure 1:
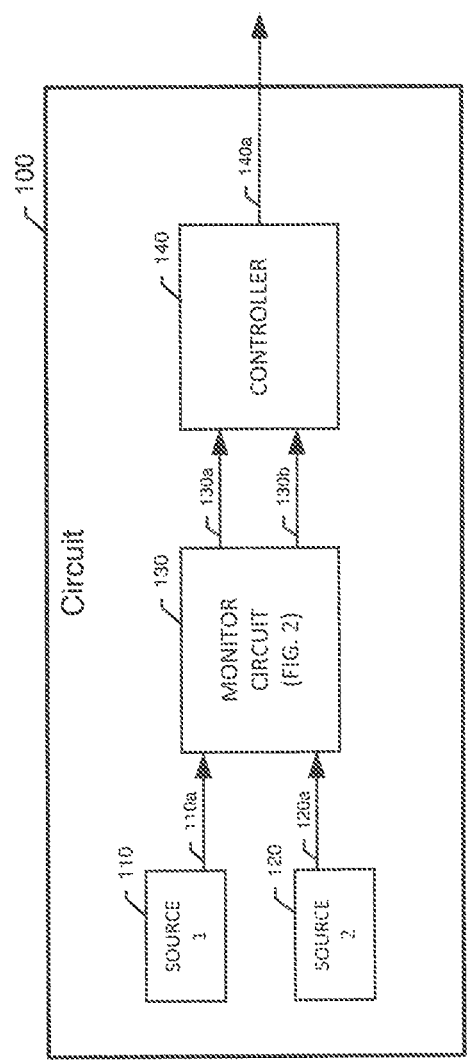
FIG. 1 is a block diagram of an example integrated circuit including a monitor circuit for monitoring a level of regulated sources, such as a voltage level of regulated voltages and/or a current level of regulated currents.

The features and other details of the disclosure will now be more particularly described. It will be understood that any specific embodiments described herein are shown by way of illustration and not as limitations of the concepts, systems and techniques described herein. The principal features of this disclosure can be employed in various embodiments without departing from the scope of the concepts sought to be protected.

For convenience, certain introductory concepts and terms used in the specification are collected here.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit, a digital circuit or a combination of an analog circuit and a digital circuit. The "controller" described herein may be provided as a "processor."

As used herein, the term "motion" is used to describe a variety of types of movement associated with an object, for example, including rotational movement (or "rotation") and linear (or "rectilinear") movement of the object. A "motion detector" may, for example, detect rotation of an object. A "rotation detector" is a particular type of "motion detector."

While a magnetic field sensor including a single magnetic field sensing element is described in an example below, a single magnetic field sensing element is discussed to promote simplicity, clarity and understanding in the description of the concepts, systems, circuits and techniques sought to be protected herein and is not intended to be, and should not be construed as, limiting. The concepts, circuits and techniques disclosed herein may, of course, be implemented using more than a single magnetic field sensing element.

Additionally, while circuits including a first regulator and a second regulator are described in several examples below, first and second regulators (e.g., voltage regulators) are discussed to promote simplicity, clarity and understanding in the description of the concepts, systems, circuits and techniques sought to be protected herein and is not intended to be, and should not be construed as, limiting. The concepts, systems, circuits and techniques disclosed herein may, of course, be implemented using more than first and second regulators. Moreover, in some embodiments the first and second regulators may be provided as part of a single regulator with the single regulator configured to output two or more regulated signals (e.g., a first regulated signal and a second regulated signal).

Further, while monitor circuits for monitoring a voltage level of a first regulated voltage and a second regulated voltage and/or a current level of a first regulated current and a second regulated current are described in several examples below, first and second regulated voltages and first and second regulated currents are discussed to promote simplicity, clarity and understanding in the description of the concepts, systems, circuits and techniques sought to be protected herein and is not intended to be, and should not be construed as, limiting. The monitor circuits disclosed herein may, of course, be implemented to monitor more than first and second regulated voltages and more than first and second regulated currents.

Referring to FIG. 1, a circuit 100 capable of monitoring a voltage level of voltage signals and/or a current level of current signals is shown. The circuit 100 includes a first source 110 and a second source 120, each of which may take a variety of forms. For example, the first source 110 and the second source 120 may take the form of a voltage regulator and may be provided as a linear regulator (e.g., NPN Darlington or Low-dropout (LDO) regulator) or a switching regulator (e.g., Buck, Buck-boost, or Boost regulator), as a few examples. The first source 110 generates a first regulated voltage 110a and the second source 120 generates a second regulated voltage 120a. In some embodiments, the first regulated voltage 110a and the second regulated voltage 120a are substantially the same (i.e., same fixed output voltages). In other embodiments, the first regulated voltage 110a and the second regulated voltage 120a are different.

The circuit 100 also includes a monitor circuit 130 for monitoring a voltage level of the first regulated voltage 110a and the second regulated voltage 120a. In the example embodiment shown, the monitor circuit 130 is coupled to receive the first regulated voltage 110a generated by the first source 110 and the second regulated voltage 120a generated by the second source 120 and configured to generate a first signal 130a, which in some embodiments is representative of a first error, or fault signal indicative of at least one of an overvoltage condition (e.g., a higher than expected voltage level) of the first regulated voltage 110a and an undervoltage condition (e.g., a lower than expected voltage level) of the second regulated voltage 120a. The monitor circuit 130 is further configured to generate a second signal 130b, which in some embodiments is representative of a second error, or fault signal indicative of at least one of an undervoltage condition of the first regulated voltage 110a and an overvoltage condition of the second regulated voltage 120a.

The circuit 100 additionally includes a controller 140 coupled to receive the first signal 130a and the second signal 130b and configured to generate a controller output signal 140a. The controller output signal 140a may be provided as an error output signal indicative of one or more of the overvoltage condition of the first regulated voltage, the undervoltage condition of the second regulated voltage, the undervoltage condition of the first regulated voltage, and the overvoltage condition of the second regulated voltage. Additionally, in some embodiments, the controller output signal 140a is received by circuitry (e.g., analog, digital or mixed-signal circuitry) configured to generate corresponding signals (e.g., filtered signals, amplified signal, and the like).

In an alternative embodiment, the circuit 100 is additionally or alternatively capable of monitoring a current level of current signals and the first source 110 and the second source 120 take the form of a current regulator. As one example, the first source 110 may generate a first regulated current and the second source 120 may generate a second regulated current. The monitor circuit 130 may monitor a current level of the first regulated current and the second regulated current and generate a first signal, which in some embodiments is representative of a first error, or fault signal indicative of at least one of an overcurrent condition (e.g., a higher than expected current level) of the first regulated current and an undercurrent condition (e.g., a lower than expected current level) of the second regulated current. The monitor circuit 130 may also generate a second signal, which in some embodiments is representative of a second error, or fault signal indicative of at least one of an undercurrent condition of the first regulated current and an overcurrent condition of the second regulated current.

It will be appreciated that the circuit 100 may take any form of circuit which would benefit from monitoring of a voltage level and/or a current level of signals. For example, the circuit 100 can be provided in the form of an integrated circuit such as a digital integrated circuit, analog integrated circuit, or a mixed-signal integrated circuit and representative of a sensor integrated circuit containing sensor circuitry. As one example, the circuit 100 may be a magnetic field sensor integrated circuit that contains one or more magnetic field sensing elements and that provides an output signal indicative of a magnetic field, as will be discussed further below.

Figure 2:
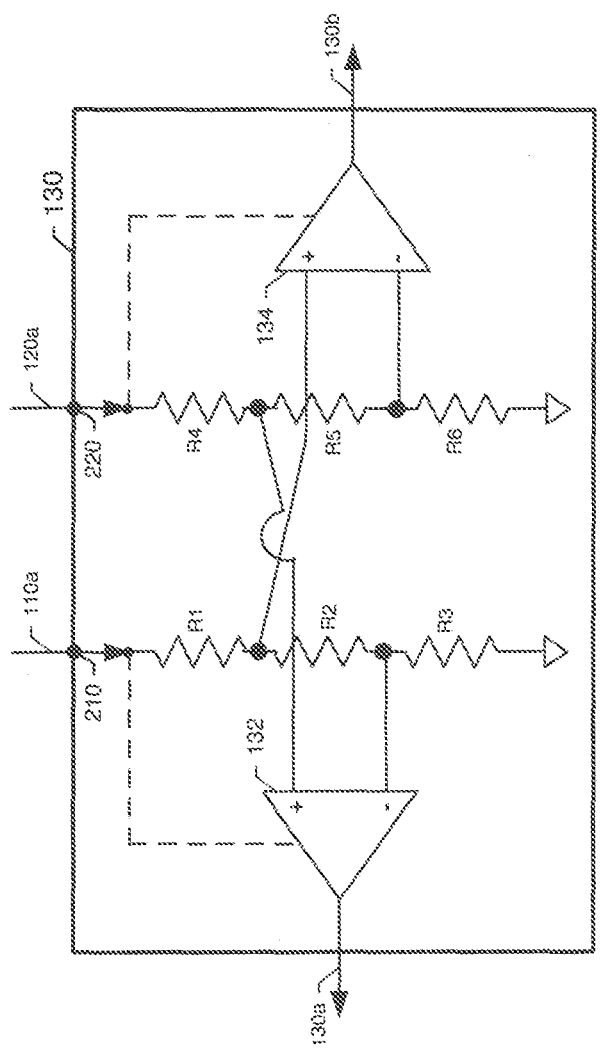
FIG. 2 is a block diagram of an example monitor circuit of the integrated circuit of FIG. 1.

Referring to FIG. 2, in which like elements of FIG. 1 are shown having like reference designations, the monitor circuit 130 is coupled to receive the first regulated level 110a at a first terminal 210 and the second regulated level 120a at a second terminal 220. In an embodiment, the first regulated level 110a is a regulated voltage level that can be generated by a first regulator, which can be the same as or similar to the source 110 (FIG. 1), and the second regulated level 120a is a regulated voltage level that can be generated by a second regulator, which can be the same as or similar to the source 120 (FIG. 1). In some embodiments, the first regulated voltage 110a and the second regulated voltage 120a can be generated by a single source (not shown).

The monitor circuit 130 includes a first circuit including a first resistor divider, as indicated by R1, R2 and R3, and a first comparator 132. The first resistor divider is coupled between the first terminal 210 of the monitor circuit 130 and a reference potential (e.g., GND). The value of resistors R1, R2 and R3 and the ratio of the values of resistors R1, R2 and R3 can, for example, be chosen based on a voltage level associated with the first regulated voltage 110a and/or a predetermined range of voltages of the first regulated voltage 110a.

The first comparator 132 is coupled to receive a voltage associated with the first resistor divider (e.g., a level shifted voltage) at a first comparator input (e.g., an inverting input) and a voltage associated with the second regulated voltage 120a at a second comparator input (e.g., a non-inverting input) and is configured to generate a first comparison signal (e.g., a first error signal) 130a in response to the first comparator input and the second comparator input. The first comparison signal 130a may have edges occurring in response to a comparison of the first comparator input and the second comparator input. In the embodiment shown in FIG. 2, when the voltage at the first comparator input is greater than the voltage at the second comparator input, the first comparator output (i.e., the first comparison signal 130a) is at a logic low level and when the voltage at the first comparator input is less than the voltage at the second comparator input, the first comparator output (i.e., the first comparison signal 130a) is at a logic high level.

The monitor circuit 130 additionally includes a second circuit having a second resistor divider, as indicated by R4, R5 and R6, and a second comparator 134. The second resistor divider, which can be the same as or similar to the first resistor divider in some embodiments, is coupled between the second terminal 220 of the monitor circuit 130 and a reference potential (e.g., GND). Similar to resistors R1, R2 and R3 of the first resistor divider, the value of resistors R4, R5 and R6 and the ratio of the values of resistors R4, R5 and R6 can be chosen based on a voltage level associated with the second regulated voltage 120a and/or a predetermined range of voltages of the second regulated voltage 120a.

The second comparator 134, which can be the same as or similar to first comparator 132, is coupled to receive a voltage associated with the second resistor divider at a first comparator input (e.g., an inverting input) and a voltage associated with the first regulated voltage 110a at a second comparator input (e.g., a non-inverting input) and is configured to generate a second comparison signal (e.g., a second error signal) 130b in response to the first comparator input and the second comparator input. Similar to first comparison signal 130a, the second comparison signal 130b may have edges occurring in response to a comparison of the first comparator input and the second comparator input. In the embodiment shown in FIG. 2, when the voltage at the first comparator input of the second comparator 134 is greater than the voltage at the second comparator input, the second comparator output (i.e., the second comparison signal 130b) is at a logic low level and when the voltage at the first comparator input is less than the voltage at the second comparator input, the second comparator output (i.e., the second comparison signal 130b) is at a logic high level.

In the embodiment in which the first regulated level 110a is a regulated voltage and the second regulated level 120a is a regulated voltage, the first comparator 132 may be powered by the first regulated voltage 110a (as is represented by the dotted line from regulated voltage 110a to power comparator 132) and the second comparator 134 may be powered by the second regulated voltage 120a (as is represented by the dotted line from regulated voltage 120a to power comparator 134).

In some embodiments, at least one of the first resistor divider and the second resistor divider are optional, in which case a first one of the comparator inputs of the first and/or second circuits may be coupled to the first regulated voltage and a second one of the second comparator inputs of the first and/or second circuits may be coupled to the second regulated voltage.

Additionally, in some embodiments, at least one of the first comparator 132 and the second comparator 134 has hysteresis. The hysteresis can be selected based on a voltage condition to be detected, such as an overvoltage condition or an undervoltage condition, as will be explained below.

While various factors may be considered in selecting the first resistor divider, the second resistor divider, and comparator hysteresis, for example, in some embodiments these selections are made to cause the first comparison signal 130a to transition when the second regulated voltage 120a falls below a predetermined level indicative of an undervoltage condition of the second regulated voltage 120a and the first comparison signal 130a to transition when the first regulated voltage 110a goes above a predetermined level indicative of an overvoltage condition of the first regulated voltage 110a. Additionally, in some embodiments, these selections are made to cause the second comparison signal 130b to transition when the first regulated voltage 110a falls below a predetermined level indicative of an undervoltage condition of the first regulated voltage 110a and the second comparison signal 130b to transition when the second regulated voltage 120a goes above a predetermined level indicative of an overvoltage condition of the second regulated voltage 120a.

In an alternative embodiment, the monitor circuit 130 is coupled to receive a first regulated current at the first terminal 210 and a second regulated current at the second terminal 220. As one example, the first comparator 132 may be coupled to receive a voltage proportional to current (e.g., the first regulated current) flowing through the first resistor divider at the first comparator input (e.g., an inverting input) and a voltage proportional to current (e.g., the second regulated current) flowing through the second resistor divider at the second comparator input (e.g., a non-inverting input) and may be configured to generate the first comparison signal (e.g., a first error signal) 130a in response to the first comparator input and the second comparator input. The first comparator 132 may be powered by a first voltage (e.g., a first regulated voltage) as may be generated by a first voltage source (not shown), which may be provided as part of or separate from the circuit 100 (FIG. 1).

Additionally, the second comparator 134 may be coupled to receive a voltage proportional to current (e.g., the second regulated current) flowing through the second resistor divider at the first comparator input (e.g., an inverting input) and a voltage proportional to current (e.g., the first regulated current) flowing through the first resistor divider at the second comparator input (e.g., a non-inverting input) and may be configured to generate the second comparison signal (e.g., a first error signal) 130b in response to the first comparator input and the second comparator input. The second comparator 134 may be powered by a second voltage (e.g., a second regulated voltage), which may be the same as or similar to the first voltage. Additionally, the second voltage may be generated by a second voltage source (not shown), which may be the same as or similar to the first voltage source. In some embodiments, both the first voltage and the second voltage are generated by a same voltage source.

One or more of the first resistor divider, the second resistor divider, and/or comparator hysteresis in the monitor circuit 130 may be selected to cause the first comparison signal 130a to transition when the second regulated current falls below a predetermined level indicative of an undercurrent condition of the second regulated current and the first comparison signal 130a to transition when the first regulated current goes above a predetermined level indicative of an overcurrent condition of the first regulated current. Additionally, in some embodiments, these selections may be made to cause the second comparison signal 130b to transition when the first regulated current falls below a predetermined level indicative of an undercurrent condition of the first regulated current and the second comparison signal 130b to transition when the second regulated current goes above a predetermined level indicative of an overcurrent condition of the second regulated current.

With the described circuits and techniques, two regulated voltages and/or two regulated currents are monitored in real-time for both overvoltage and undervoltage conditions and/or for both overcurrent and undercurrent conditions, respectively, with only two comparators (rather than four comparators as would generally be required to detect four different error conditions). This resulting reduction in the number of devices required for error detection is generally advantageous because of space and cost considerations as well as the advantage of having fewer devices to potentially fail. The space considerations are particularly advantageous in embodiments in which the circuitry is provided in the form of an integrated circuit. Furthermore, the described regulated voltage monitoring arrangement permits such fault monitoring of two regulated voltages without requiring an additional, third, regulated voltage to power the monitoring circuitry.

Figure 3:
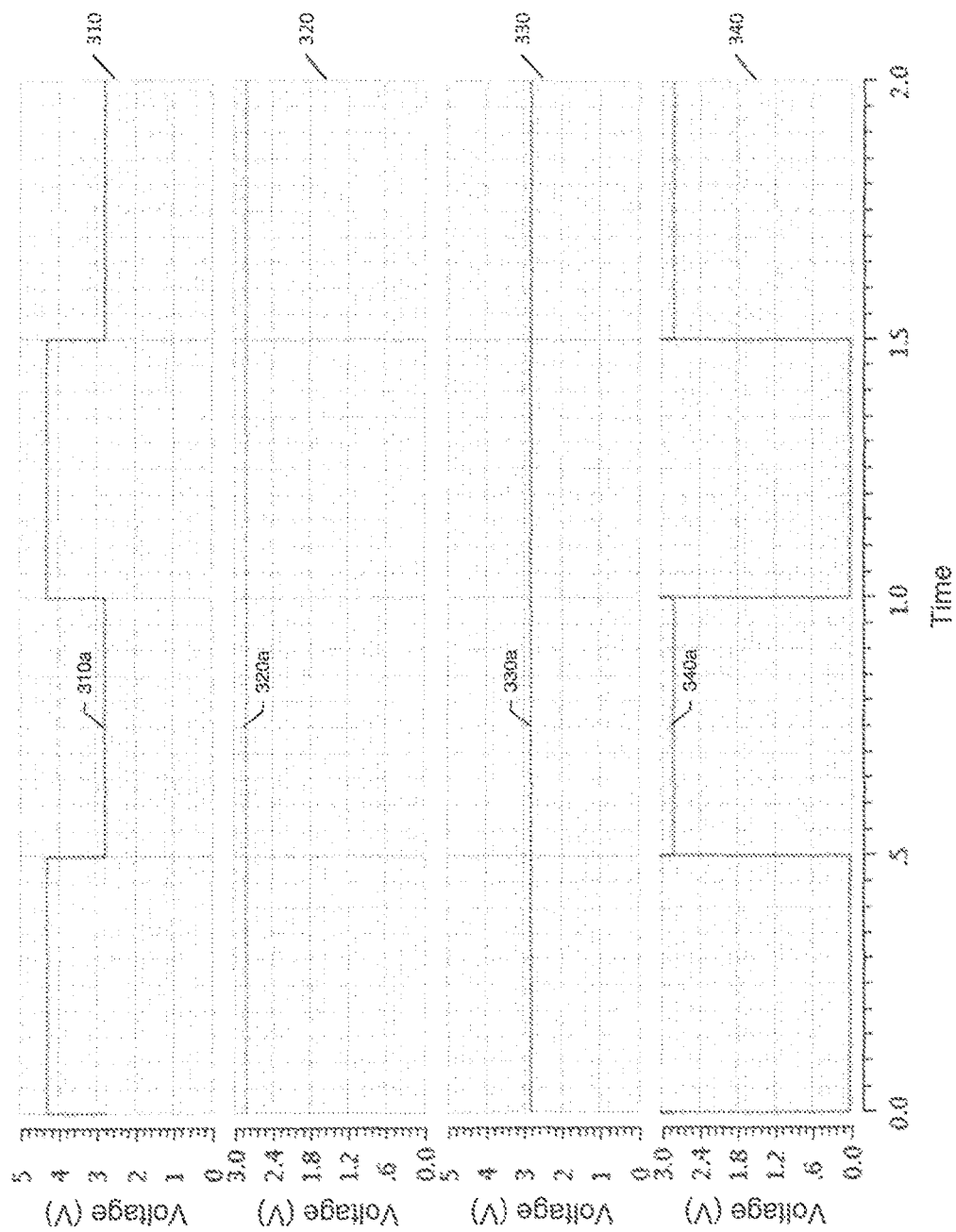
FIG. 3 shows illustrative signal waveforms as may be generated by the monitor circuit of FIG. 2 in response to an error in a regulated voltage.
Figure 3A:
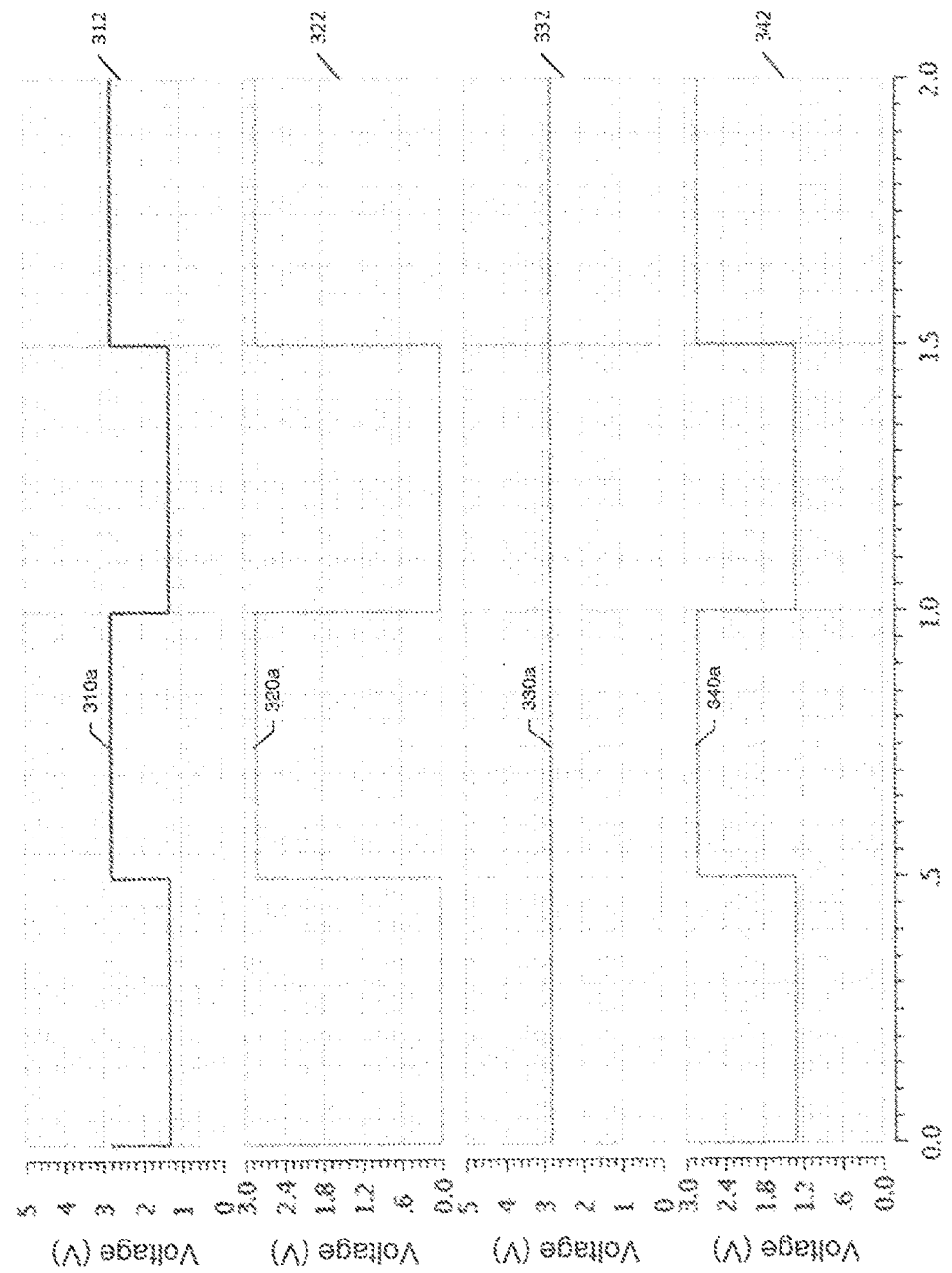
FIG. 3A shows illustrative signal waveforms as may be generated by the monitor circuit of FIG. 2 in response to a different error in a regulated voltage.
Figure 3B:
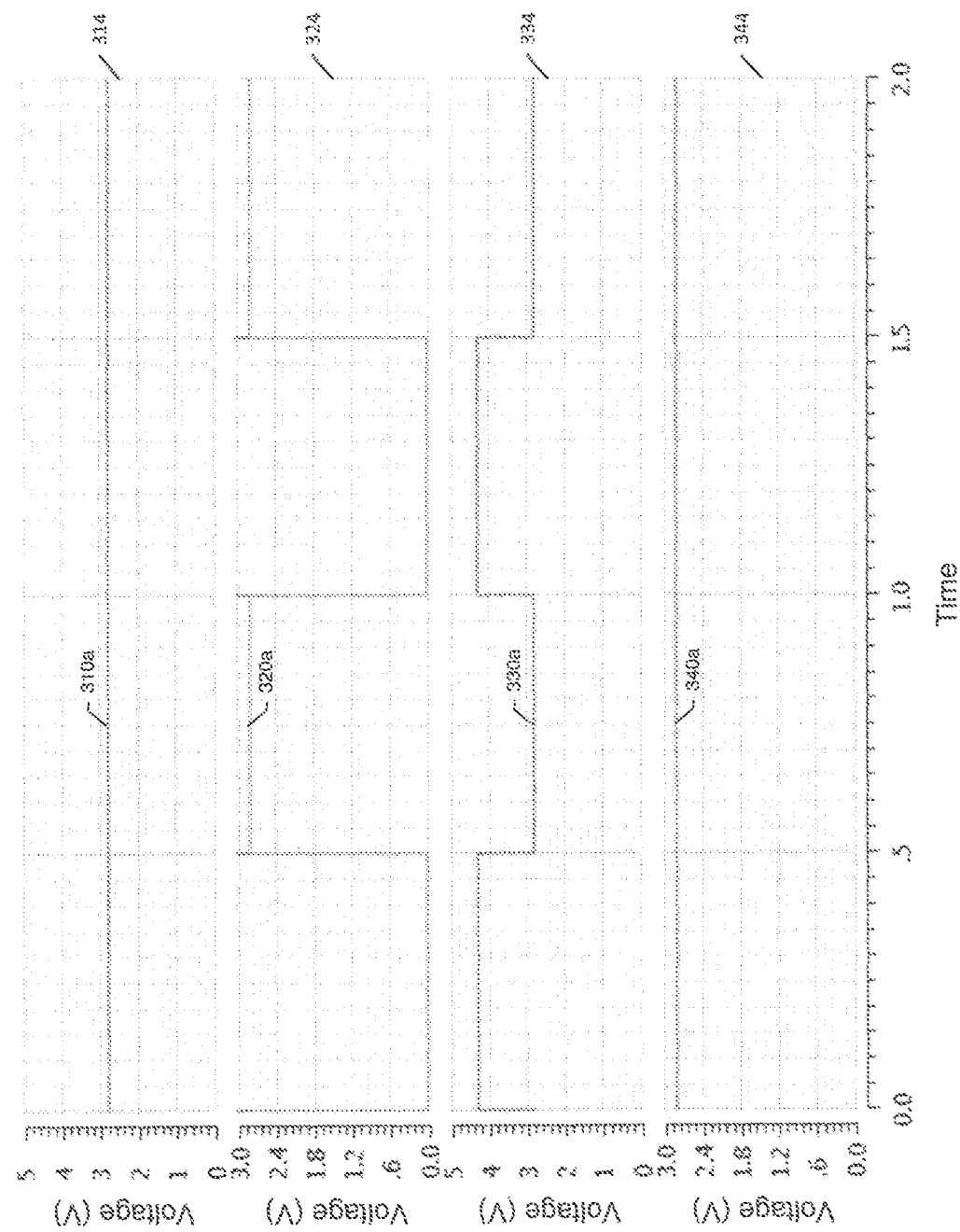
FIG. 3B shows illustrative signal waveforms as may be generated by the monitor circuit of FIG. 2 in response to a still different error in a regulated voltage.
Figure 3C:
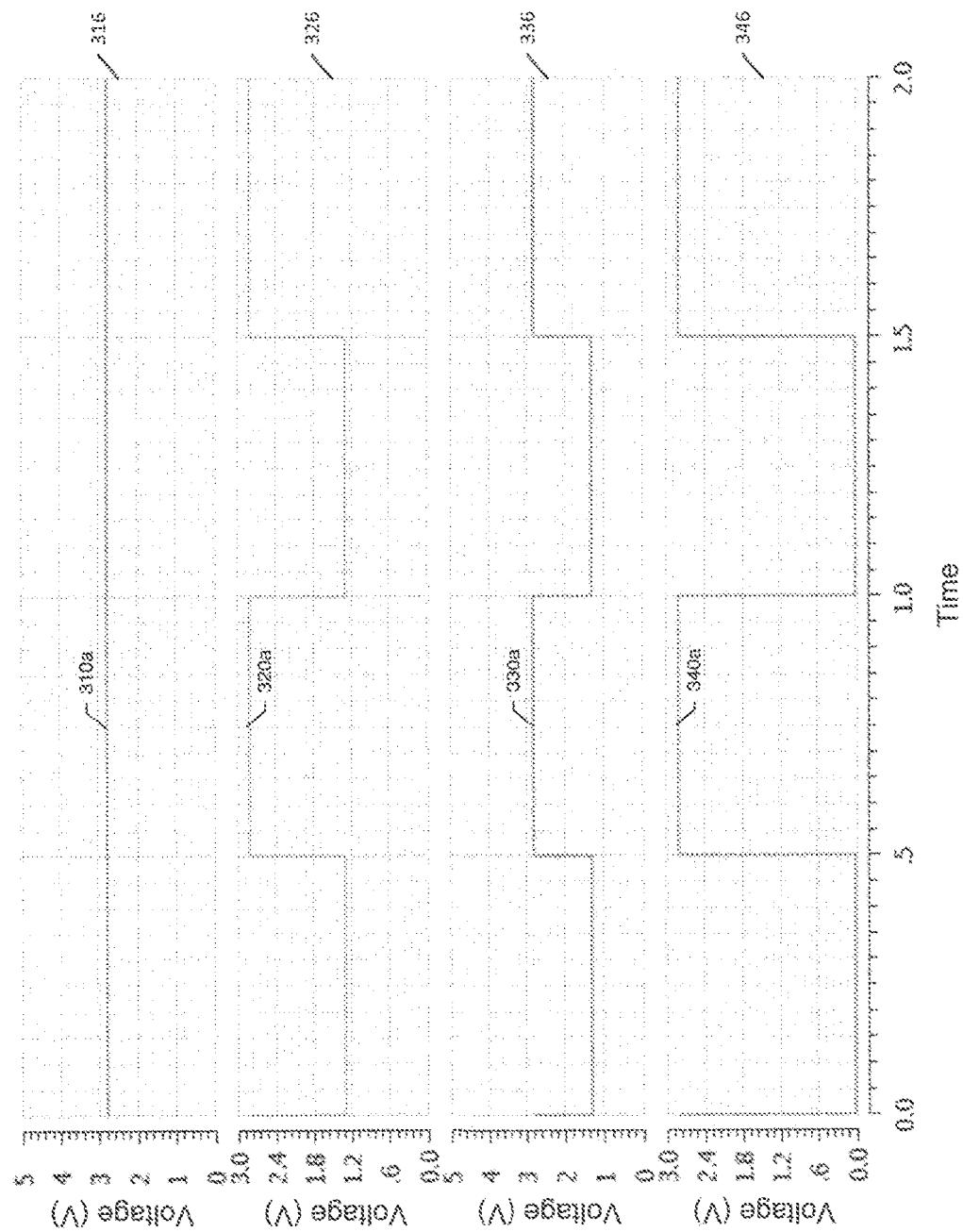
FIG. 3C shows illustrative signal waveforms as may be generated by the monitor circuit of FIG. 2 in response to yet another error in a regulated voltage.

Referring to FIGS. 3-3C, illustrative signal waveforms as may be generated by a plurality of regulators, which can be the same as or similar to first and second sources 110, 120 shown in FIG. 1, and illustrative signal waveforms as may be generated by a monitor circuit, which can be the same as or similar to monitor circuit 130 shown in FIG. 2, are shown in a plurality of plots (e.g., 310, 320, 330, 340, shown in FIG. 3). While the illustrative waveforms are associated with use of the monitor circuit 130 to monitor first and second regulated voltages from first and second respective voltage regulators, it will be appreciated that similar waveforms can be associated with use of the monitor circuit to monitor first and second current levels from first and second respective regulated current sources. The plots have a horizontal axis with a scale in time units and a vertical axis with a scale in voltage units of volts (V). Each of FIGS. 3-3C shows a first regulated voltage signal representative of an example first regulated voltage (e.g., 110a, shown in FIG. 1) generated by a regulator (e.g., 110, shown in FIG. 1), for example and a second regulated voltage signal representative of an example second regulated voltage (e.g., 120a, shown in FIG. 1) generated by a regulator (e.g., 120, shown in FIG. 1), for example. Each of FIGS. 3-3C also shows a first comparison signal representative of an example first comparison signal (e.g., 130a, shown in FIG. 2) generated by the monitor circuit and a second comparison signal 320a representative of an example second comparison signal (e.g., 130b, shown in FIG. 2) generated by the monitor circuit. The first comparison signal, which in some cases can be representative of a first error signal, can be generated by a first example comparator (e.g., 132, shown in FIG. 2) and the second comparison signal, which in some cases can be representative of a second error signal, can be generated by a second example comparator (e.g., 134, shown in FIG. 2).

Referring to FIG. 3, a plot 310 includes a signal 310*a* representative of a first regulated voltage signal, a plot 320 includes a signal 320*a* representative of a second comparison signal, a plot 330 includes a signal 330*a* representative of a second regulated voltage signal and a plot 340 includes a signal 340*a* representative of a first comparison signal. In the example embodiment shown, at least signal 320*a* and signal 340*a* are provided as digital signals having a logic high level and a logic low level. It will be appreciated, however, that the particular delineation of which signals are provided as analog signals and digital signals can be varied.

As illustrated, when signal 310*a* has a voltage level that is greater than a voltage level of signal 330*a*, signal 340*a* is at a logic low level (or, transitions from a logic high level to a logic low level). As one example, this set of conditions may be representative of an overvoltage condition of signal 310*a* (i.e., an overvoltage condition of the first regulated signal). As is also illustrated, when signal 310*a* has a voltage level that is less than a voltage level of signal 330*a*, signal 340*a* is at a logic high level (or, transitions from a logic low level to a logic high level).

Further, as illustrated, signal 320*a* is at a logic high level when signal 310*a* has a voltage level that is greater than a voltage level of signal 330*a* and signal 320*a* is at a logic low level when signal 310*a* has a voltage level that is less than a voltage level of signal 330*a*. In the illustrated embodiment, signal 310*a* has a voltage level that is greater than or equal to a voltage level of signal 330*a* for the time period shown, and thus, signal 320*a* remains at a logic high level.

Referring to FIG. 3A, in which like signals of FIG. 3 are shown having like reference designations, a plot 312 includes a signal 310*a*, a plot 322 includes a signal 320*a*, a plot 332 includes a signal 330*a* and a plot 342 includes a signal 340*a*.

As illustrated, when signal 310*a* has a voltage level that is less than a voltage level of signal 330*a*, signal 320*a* is at a logic low level (or, transitions from a logic high level to a logic low level). As one example, such conditions may be representative of an undervoltage condition of signal 310*a* (i.e., an undervoltage condition of the first regulated signal). It will be appreciated that the signal 310*a* having a level less than the level of signal 330*a* can also be indicative of a short circuit condition between the first regulated signal 110*a* and ground. As is also illustrated, when signal 310*a* has a voltage level that is greater than a voltage level of signal 330*a*, signal 320*a* is at a logic high level (or, transitions from a logic low level to a logic high level).

Referring to FIG. 3B, in which like signals of FIG. 3 are shown having like reference designations, a plot 314 includes a signal 310*a*, a plot 324 includes a signal 320*a*, a plot 334 includes a signal 330*a* and a plot 344 includes a signal 340*a*.

As illustrated, when signal 310*a* has a voltage level that is less than a voltage level of signal 330*a*, signal 320*a* is at a logic low level (or, transitions from a logic high level to a logic low level). As one example, such conditions may be representative of an overvoltage condition of signal 330*a* (i.e., an overvoltage condition of the second regulated signal). It will be appreciated that the signal 330*a* having a level less than signal 310*a* can also be indicative of a short circuit condition between the second regulated signal 120*a* and ground. As is also illustrated, when signal 310*a* has a voltage level that is greater than a voltage level of signal 330*a*, signal 320*a* is at a logic high level (or, transitions from a logic low level to a logic high level).

Referring to FIG. 3C, in which like signals of FIG. 3 are shown having like reference designations, a plot 316 includes a signal 310*a*, a plot 326 includes a signal 320*a*, a plot 336 includes a signal 330*a* and a plot 346 includes a signal 340*a*.

As illustrated, when signal 330*a* has a voltage level that is less than a voltage level of signal 310*a*, signal 340*a* is at a logic low level (or, transitions from a logic high level to a logic low level). As is also illustrated, when signal 330*a* has a voltage level that is greater than a voltage level of signal 310*a*, signal 340*a* is at a logic high level (or, transitions from a logic low level to a logic high level). As one example, such conditions may be representative of an undervoltage condition of signal 330*a* (i.e., an undervoltage condition of the second regulated signal).

Figure 4:
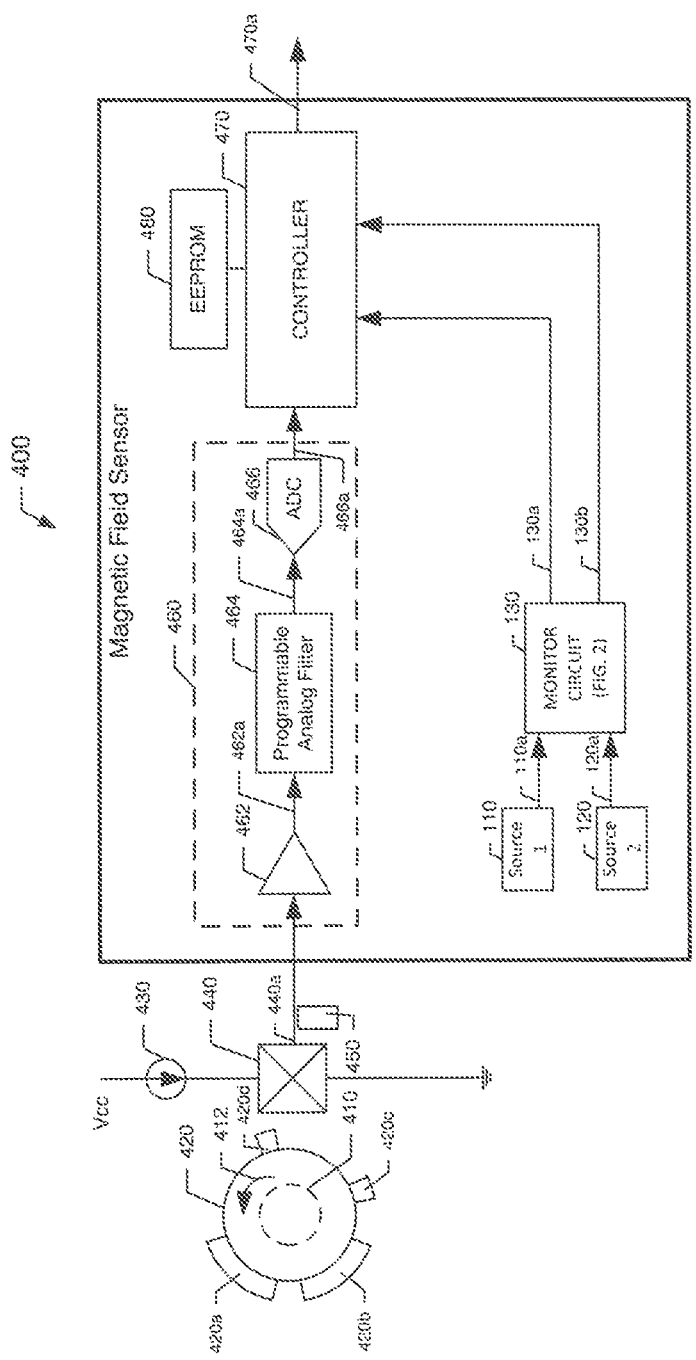
FIG. 4 is a block diagram of an example integrated circuit for detecting motion of an object, the integrated circuit including the monitor circuit of FIG. 2.

Referring to FIG. 4, in which like elements of FIGS. 1 and 2 are provided having like reference designations, a magnetic field sensor 400 capable of detecting motion (e.g., speed of motion and/or direction of motion) of an object having features, e.g., gear teeth 420*a*, 420*b*, 420*c*, 420*d* of a ferromagnetic gear 420 (hereinafter "object 420"), is shown. The object 420 can be disposed, for example, on a shaft 410 configured to rotate in a direction 412.

The magnetic field sensor 400 includes one or more magnetic field sensing elements, as indicated by magnetic field sensing element 440 in the example embodiment shown. The magnetic field sensing element 440 is driven by a current source 430 and configured to generate a magnetic field signal 440*a* in response to a magnetic field associated with the object 420 as may be generated, for example, by a magnet 450 disposed proximate to or within the magnetic field sensor 400. Motion of the object 420 can result in variations of the magnetic field sensed by the magnetic field sensing element 440 and, thus, result in variations of the magnetic field signal 440*a* generated by the magnetic field sensing element 440.

Although the magnetic field sensing element 440 is depicted as a Hall effect element, in some embodiments the magnetic field sensing element 440 is, for example, provided as a magnetoresistance element where the magnetoresistance element may be an anisotropic magnetoresistance (AMR) element, a giant magnetoresistance (GMR) element, a tunneling magnetoresistance (TMR) element, a magnetic tunnel junction (MTJ) element, or a spin valve element. It should be appreciated that the magnetic field sensing element 440 (which may comprise more than one magnetic field sensing element in some embodiments) may take any form suitable for detecting motion of the object 420 by sensing a magnetic field affected by such motion.

The object 420 may be a ferromagnetic object. The ferromagnetic object can be a magnetic object and the magnetic field detected by the magnetic field sensing element 440 may be generated by the object 420 itself and may vary depending on positions of the object 420 relative to the magnetic field sensor 400.

Furthermore, although the object 420 is shown in the form of a ferromagnetic gear in the example embodiment, the object 420 may take other forms. For example, the object 420 may take the form of a ring magnet having magnetic domains that are detected by the magnetic field sensor 400. Additionally, the object 420 may be coupled to an automobile wheel, steering shaft, or a camshaft, as a few examples.

The magnetic field sensor 400 may be provided in the form of an integrated circuit, which can be the same as or similar to the circuit 100 described above in conjunction with FIG. 1. The sensor 400 includes a signal path 460 (e.g., an analog, digital or mixed signal path) coupled to receive the magnetic field signal 440a and configured to generate a signal (e.g., digital signal 466a) representative of the magnetic field signal 440a.

The illustrated signal path 460 includes an amplifier 462, a filter 464 and an analog-to-digital converter (ADC) 466. The amplifier 462 is coupled to receive the magnetic field signal 440a generated by the magnetic field sensing element 440 and configured to generate an amplified signal 462a. The filter 464, which can be a programmable analog filter for example, is coupled to receive the amplified signal 462a and configured to generate a filtered signal 464a. The ADC 466 is coupled to receive the filtered signal 464a and configured to generate a corresponding digital signal 466a.

The magnetic field sensor 400 additionally includes a first source 110 providing a first regulated voltage 110a (or a first regulated current), a second source 120 providing a second regulated voltage 120a (or a second regulated current), and a monitor circuit 130 similar to like elements described above in conjunction with FIGS. 1 and 2. Thus, monitor circuit 130 is responsive to the first and second regulated voltages 110a, 120a (or to the first and second regulated currents) and generates comparison, or error signals 130a, 130b.

The magnetic field sensor 400 further includes a controller 470 and memory device 480 (e.g., EEPROM). The controller 470, which can be a synchronous digital controller or an analog controller for example, is coupled to receive at least the digital signal 466a, the first signal 130a and the second signal 130b. The controller 470 is responsive to at least the first signal 130a and the second signal 130b to generate a controller output signal 470a (e.g., an error signal). In some embodiments, controller output signal 470a is indicative of one or more of the overvoltage condition of the first regulated voltage 110a, the undervoltage condition of the second regulated voltage 120a, the undervoltage condition of the first regulated voltage 110a, and the overvoltage condition of the second regulated voltage 120a. Additionally, in embodiments where the first source 110 provides a first regulated current and the second source provides a second regulated current, controller output signal 470a may be indicative of one or more of the overcurrent condition of the first regulated current, the undercurrent condition of the second regulated current, the undercurrent condition of the first regulated current, and the overcurrent condition of the second regulated current.

In embodiments where the controller 470 is additionally responsive to the digital signal 466a in generating the controller output signal 470a, for example, the controller output signal 470a may perform gain and/or offset correction as may be achieved with a gain adjustment processor and an offset adjustment processor in the controller 470. Additionally, the controller 470 can be coupled to receive stored gain correction coefficients and stored offset correction coefficients, respectively, from the memory device 480, with the controller output signal 470a generated accordingly. It will be appreciated that the stored gain correction coefficients and the stored offset correction coefficients may be established in a variety of manners, such as those described in U.S. Pat. No. 8,350,563 entitled "Magnetic Field Sensor and Method used in a Magnetic Field Sensor that Adjusts a Sensitivity and/or an Offset Over Temperature" which is assigned to the Assignee of the present disclosure and incorporated herein by reference in its entirety.

The controller 470 may contain or be coupled to circuitry configured to generate a signals (e.g., motion detection output signals) indicative of one or more of a speed of motion of the object 420 or a direction of motion of the object 420. One such circuit is described in co-pending U.S. patent application Ser. No. 14/600,826 entitled "Methods And Apparatus For Generating A Threshold Signal In A Magnetic Field Sensor," which is assigned to the Assignee of the present disclosure and incorporated herein by reference in its entirety.

While the magnetic field sensor 400 may be provided in the illustrated form of an integrated circuit with an analog front end portion and a digital portion, it will be appreciated that the particular delineation of which circuit functions are implemented in an analog fashion or with digital circuitry and signals can be varied. Further, some of the illustrated circuit functions can be implemented on an integrated circuit sensor and other circuitry and functionality can be implemented on separate circuits (e.g., additional substrates within the same integrated circuit package, or additional integrated circuit packages, and/or on circuit boards).

In some embodiments, one or more portions of the signal path 460 (e.g., amplifier 462, filter 464, ADC 466) may be provided as part of the controller 470 and, thus, signal path 460 is shown in phantom. Additionally, in some embodiments, the controller 470 can perform the function, operation, or sequence of operations of one or more portions of the signal path 460. Moreover, in some embodiments, the memory device 480 is provided as part of the controller 470 (e.g., as onboard EEPROM).

Figure 5:
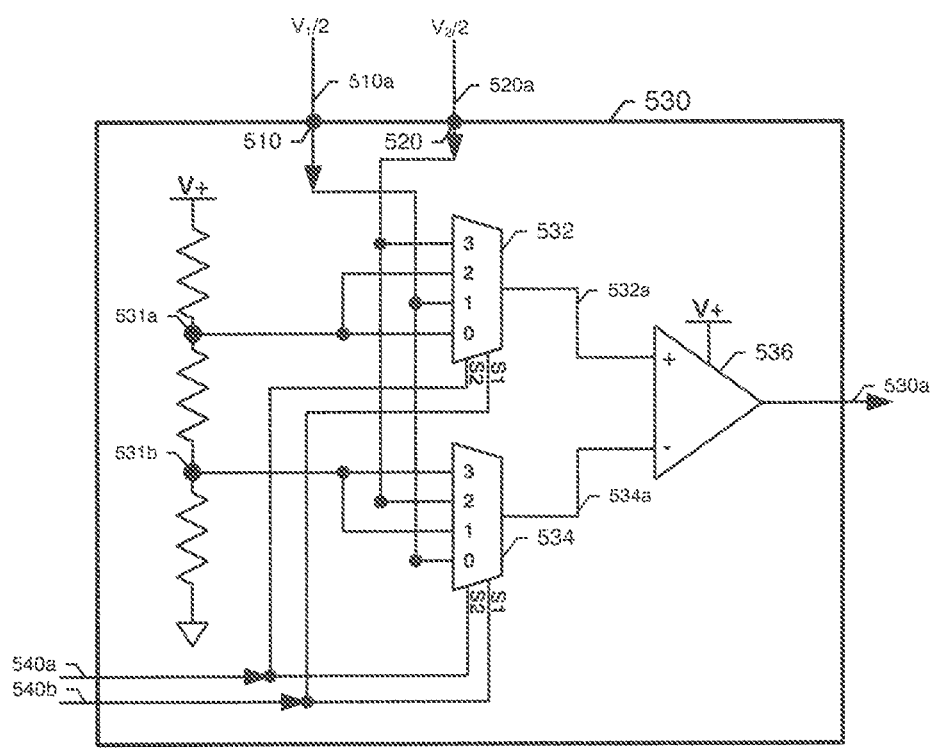
FIG. 5 is a block diagram of an example monitor circuit in accordance with another embodiment.

Referring now to FIG. 5, a monitor circuit 530 in accordance with another embodiment is shown. The monitor circuit 530, which may be provided on an integrated circuit such as integrated circuit 100 (FIG. 1), for example, is coupled to receive a first regulated voltage 510a, which can be the same as or similar to the first regulated voltage 110a (FIG. 1) or a particular percentage (e.g., fifty percent) of the first regulated voltage 110a, for example, at a first input terminal 510. The monitor circuit 530 is also coupled to receive a second regulated voltage 520a, which can be the same as or similar to the second regulated voltage 120a (FIG. 1) or a particular percentage (e.g., fifty percent) of the second regulated voltage 120a, for example, at a second input terminal 520. The first regulated voltage 510a can be generated by a first source, which can be the same as or similar to the source 110 (FIG. 1), and the second regulated voltage 520a can be generated by a second source, which can be the same as or similar to the source 120 (FIG. 1).

The monitor circuit 530 includes two or more multiplexers, for example, a first multiplexer 532 and a second multiplexer 534, as shown, each coupled to receive the first regulated voltage 510a and the second regulated voltage 520a at respective inputs. The first multiplexer 532 and the second multiplexer 534 are also coupled to receive a threshold voltage ($V_{TH}$), for example, a first threshold voltage and a second threshold voltage, as shown, and to provide a selected one of the first regulated voltage, the second regulated voltage, or and the received threshold voltages at a respective output. The first threshold voltage and the second threshold voltage (e.g., voltages at nodes 531a, 531b) can be generated from a voltage V+, which may be provided from a third regulated voltage, for example. Additionally, the first threshold voltage and the second threshold voltage can be selected based on various factors, such as available voltage levels of the monitor circuit 530 and/or level shifting by a resistor divider coupled between the voltage V+ and a reference potential (GND).

The monitor circuit 530 also includes a comparator 536 coupled to receive a signal 532a from the output of the first multiplexer 532 at a first comparator input (e.g., a non-inverting input) and a signal 534a from the output of the second multiplexer 534 at a second comparator input (e.g., an inverting input). The comparator 536, which is powered by the voltage V+, receives the signal 532a and the signal 534a and generates a comparison signal 530a that transitions in response to a comparison of the signal 532a and the signal 534a. The comparison signal 530a, which may be the same as or similar to one or more of the first comparison signal 130a (FIG. 2) and the second comparison signal 130b (FIG. 2), can be provided as an error signal indicative of a selected one of an overvoltage condition of the first regulated voltage 510a, an undervoltage condition of the second regulated voltage 520a, an undervoltage condition of the first regulated voltage 510a, and an overvoltage condition of the second regulated voltage 520a.

In the example embodiment shown, the monitor circuit 530 is further coupled to receive one or more control signals, for example, a first control signal 540a and a second control signal 540b, as shown. The first control signal 540a and the second control signal 540b may be generated by a controller (not shown), for example, which can be the same as or similar to controller 140 (FIG. 1). The output (i.e., signals 532a, 534a) of each of multiplexers 532, 534 may be controlled by first control signal 540a and/or the second control signal 540b, which signals may be received at selector terminals S1, S2 of multiplexers 532, 534.

In operation, the control signals 540a, 540b determine which of the multiplexer input signals are coupled to the respective multiplexer output and thus to the inputs of the comparator 536 to provide the comparison signal 530a. In one embodiment, the control signal states and the resulting fault conditions that are detected is governed by the following Table.

|  | Control signal 540a is low | Control signal 540a is high |
| --- | --- | --- |
| Control signal 540b is low | Overvoltage condition of regulated voltage 510a (as is achieved by comparing regulated voltage 510a to threshold voltage 531a) | Overvoltage condition of regulated voltage 510b (as is achieved by comparing regulated voltage 510B to threshold voltage 531a) |
| Control signal 540b is high | Undervoltage condition of regulated voltage 510a (as is achieved by comparing regulated voltage 510a to threshold voltage 531b) | Undervoltage condition of regulated voltage 510b (as is achieved by comparing regulated voltage 510B to threshold voltage 531b) |

It will be appreciated that in some embodiments the monitor circuit 530 may additionally or alternatively be configured to monitor a current level of signals (e.g., a first regulated current and a second regulated current) in a same or similar manner to which the monitor circuit 530 monitors a voltage level of the first regulated voltage 510a and the second regulated voltage 520a. As one example, the monitor circuit 530 may be coupled to receive a first regulated current at the first input terminal 510 and a second regulated current at the second input terminal 520 and provide the comparison signal 530a in response to monitoring a current level of the first regulated current and the second regulated current.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A monitor circuit for monitoring a voltage level of a first regulated voltage and a second regulated voltage, the monitor circuit comprising:
a first circuit comprising a first comparator powered by the first regulated voltage, the first comparator having a first input responsive to the first regulated voltage and a second input responsive to the second regulated voltage to generate a first error signal indicative of at least one of an overvoltage condition of the first regulated voltage and an undervoltage condition of the second regulated voltage;
a second circuit comprising a second comparator powered by the second regulated voltage, the second comparator having a first input responsive to the first regulated voltage and a second input responsive to the second regulated voltage to generate a second error signal indicative of at least one of an undervoltage condition of the first regulated voltage and an overvoltage condition of the second regulated voltage;
a first resistor divider coupled to the first regulated voltage to generate a first voltage wherein the first input of the first comparator is coupled to the first voltage, wherein the first resistor divider is coupled to the first comparator and to the second comparator; and
a second resistor divider coupled to the second regulated voltage to generate a second voltage, wherein the second input of the second comparator is coupled to the second voltage, wherein the second resistor divider is coupled to the first comparator and to the second comparator.

2. The monitor circuit of claim 1, wherein the first regulated voltage is generated by a first regulator and the second regulated voltage is generated by a second regulator.

3. The monitor circuit of claim 1, wherein the first resistor divider and the second resistor divider are substantially the same.

4. The monitor circuit of claim 1, wherein at least one of the first and second comparators has hysteresis.

5. The monitor circuit of claim 1, wherein the first regulated voltage and the second regulated voltage are substantially the same.

6. The monitor circuit of claim 1, wherein the monitor circuit is provided on an integrated circuit.

7. The monitor circuit of claim 6, wherein the integrated circuit is a magnetic field sensor.

8. The monitor circuit of claim 7, wherein the magnetic field sensor comprises at least one Hall effect element.

9. The monitor circuit of claim 8, wherein the at least one Hall effect element is a planar Hall element, a vertical Hall element, or a Circular Vertical Hall (CVH) element.

10. The monitor circuit of claim 7, wherein the magnetic field sensor comprises at least one magnetoresistance element.

11. The monitor circuit of claim 10, wherein the at least one magnetoresistance element is an anisotropic magnetoresistance (AMR) element, a giant magnetoresistance (GMR) element, a tunneling magnetoresistance (TMR) element, a magnetic tunnel junction (MTJ) element, or a spin valve element.

12. The monitor circuit of claim 6, wherein the integrated circuit comprises a controller responsive to the first error signal and the second error signal to generate an error output signal indicative of one or more of the overvoltage condition of the first regulated voltage, the undervoltage condition of the second regulated voltage, the undervoltage condition of the first regulated voltage, and the overvoltage condition of the second regulated voltage.

13. The monitor circuit of claim 2, wherein the monitor circuit and at least one of the first regulator and the second regulator are provided on an integrated circuit.

14. A method for monitoring a voltage level of a first regulated voltage and a second regulated voltage, comprising:
providing a first voltage source configured to generate the first regulated voltage to power a first circuit;
providing a second voltage source configured to generate the second regulated voltage to power a second circuit;
comparing the first regulated voltage to the second regulated voltage using a first comparator to generate a first error signal indicative of at least one of an overvoltage condition of the first regulated voltage and an undervoltage condition of the second regulated voltage, the first comparator having a first input coupled to the first regulated voltage and a second input coupled to the second regulated voltage, wherein a first resistor divider is coupled to the first regulated voltage, and wherein the first resistor divider is coupled to the first comparator and to a second comparator; and
comparing the second regulated voltage to the first regulated voltage using a second comparator to generate a second error signal indicative of at least one of an undervoltage condition of the first regulated voltage and an overvoltage condition of the second regulated voltage, the second comparator having a first input coupled to the first regulated voltage and a second input coupled to the second regulated voltage, wherein a second resistor divider is coupled to the second regulated voltage, and wherein the second resistor divider is coupled to the first comparator and to the second comparator.

15. A monitor circuit for monitoring a voltage level of a first regulated voltage to power a first circuit and a second regulated voltage to power a second circuit, a monitor circuit comprising:
a first comparator powered by the first regulated voltage and having a first input coupled to a divided version of the first regulated voltage and a second input coupled to a divided version of the second regulated voltage to generate a first error signal indicative of at least one of an overvoltage condition of the first regulated voltage and an undervoltage condition of the second regulated voltage;
a second comparator powered by the second regulated voltage and having a first input coupled to a divided version of the first regulated voltage and a second input coupled to a divided version of the second regulated voltage to generate a second error signal indicative of at least one of an undervoltage condition of the first regulated voltage and an overvoltage condition of the second regulated voltages;
a first resistor divider coupled to the first regulated voltage to generate a first voltage, wherein the first input of the first comparator is coupled to the first voltage, wherein the first resistor divider is coupled to the first comparator and to the second comparator, and
a second resistor divider coupled to the second regulated voltage to generate a second voltage, wherein the second input of the second comparator is coupled to the second voltage, wherein the second resistor divider is coupled to the first comparator and to the second comparator.

16. A monitor circuit for monitoring a voltage level of a first regulated voltage generated by a first regulator and a second regulated voltage generated by a second, different regulator, the monitor circuit comprising:
a first circuit comprising a first comparator powered by the first regulated voltage, the first comparator having a first input responsive to the first regulated voltage and a second input responsive to the second regulated voltage to generate a first error signal indicative of at least one of an overvoltage condition of the first regulated voltage and an undervoltage condition of the second regulated voltage;
a second circuit comprising a second comparator powered by the second regulated voltage, the second comparator having a first input responsive to the first regulated voltage and a second input responsive to the second regulated voltage to generate a second error signal indicative of at least one of an undervoltage condition of the first regulated voltage and an overvoltage condition of the second regulated voltage; and
wherein the first regulated voltage is provided at an output of the first regulator and the second regulated voltage is provided at an output of the second regulator and wherein the first regulated voltage has a voltage level that is substantially the same as the second regulated voltage.

17. A monitor circuit for monitoring a voltage level of a first regulated voltage and a second regulated voltage, the monitor circuit comprising:
a first circuit comprising a first comparator powered by the first regulated voltage, the first comparator having a first input responsive to the first regulated voltage and a second input responsive to the second regulated voltage to generate a first error signal indicative of at least one of an overvoltage condition of the first regulated voltage and an undervoltage condition of the second regulated voltage;
a second circuit comprising a second comparator powered by the second regulated voltage, the second comparator having a first input responsive to the first regulated voltage and a second input responsive to the second regulated voltage to generate a second error signal indicative of at least one of an undervoltage condition of the first regulated voltage and an overvoltage condition of the second regulated voltage; and
wherein at least one of the first and second comparators has hysteresis.

* * * * *

UNITED STATES PATENT AND TRADEMARK OFFICE
CERTIFICATE OF CORRECTION

PATENT NO. : 10,209,279 B2  
APPLICATION NO. : 14/748692  
DATED : February 19, 2019  
INVENTOR(S) : Sam Tran et al.

Page 1 of 1

It is certified that error appears in the above-identified patent and that said Letters Patent is hereby corrected as shown below:

In the Specification

Column 1, Line 37, delete "may used" and replace with --may be used--

Column 3, Line 42, delete "multiplexer" and replace with --multiplexers--

Column 14, Line 58, delete "or and the" and replace with --; or the received threshold--

Column 16, Line 16, delete "that that scope" and replace with --that the scope--

Signed and Sealed this  
Eighteenth Day of February, 2020

Andrei Iancu  
*Director of the United States Patent and Trademark Office*